United States Patent [19]

Extance et al.

[11] Patent Number: 4,692,703
[45] Date of Patent: Sep. 8, 1987

[54] MAGNETIC FIELD SENSOR HAVING A HALL EFFECT DEVICE WITH OVERLAPPING FLUX CONCENTRATORS

[75] Inventors: Philip Extance; Roger E. Jones, both of Cambridge, England; Stewart O. Martin, Adelaide, Australia

[73] Assignee: Standard Telephones and Cables Public Limited Company, London, England

[21] Appl. No.: 704,253

[22] Filed: Feb. 22, 1985

[30] Foreign Application Priority Data

Feb. 25, 1984 [GB] United Kingdom ............ 8404967

[51] Int. Cl.$^4$ .................................. G01R 33/06
[52] U.S. Cl. ............................. 324/251; 324/117 H; 324/254; 338/32 H
[58] Field of Search ............... 324/117 H, 251, 253, 324/254, 255, 256, 257, 258, 260, 261, 244, 77 B; 338/32 H

[56] References Cited

U.S. PATENT DOCUMENTS

| 3,425,648 | 2/1969 | Wipff et al. | 324/244 X |
| 3,435,332 | 3/1969 | Kurdyla | 324/251 X |
| 4,455,527 | 6/1984 | Singer | 324/318 X |
| 4,504,785 | 3/1985 | Tucker et al. | 324/77 B X |
| 4,505,054 | 3/1985 | Clark et al. | 33/361 X |
| 4,558,276 | 12/1985 | Comeau et al. | 324/117 H |
| 4,587,509 | 5/1986 | Pitt et al. | 324/260 X |

FOREIGN PATENT DOCUMENTS

| 1106410 | 5/1961 | Fed. Rep. of Germany. |
| 868765 | 5/1961 | United Kingdom. |
| 890411 | 2/1962 | United Kingdom. |
| 1103536 | 2/1968 | United Kingdom. |
| 1124576 | 8/1968 | United Kingdom. |

OTHER PUBLICATIONS

Soviet Inventions Illustrated, Section El, Jan. 6, 1982, week D47, Derwent Publications Ltd., London, SU-800-917, (Rudoi).

Primary Examiner—Gerard R. Strecker
Assistant Examiner—Robert W. Mueller
Attorney, Agent, or Firm—Kerkam, Stowell, Kondracki & Clarke

[57] ABSTRACT

An alternating magnetic excitation field is generated in the flux concentrators (11,12) of a Hall effect device, including a Hall element (13), by passing an a.c. current through a coil (14). This alternating field serves to drive the flux concentrators into and out of saturation. In the presence of a d.c. magnetic field and when a Hall current is applied to the Hall element, a second harmonic component is generated in the output voltage of the Hall element (13); the amplitude of the second harmonic component providing a measure of the d.c. magnetic field. In an alternative arrangement (FIG. 4) the flux concentrator means is in loop form rather than in a flat configuration as in FIG. 3.

15 Claims, 8 Drawing Figures

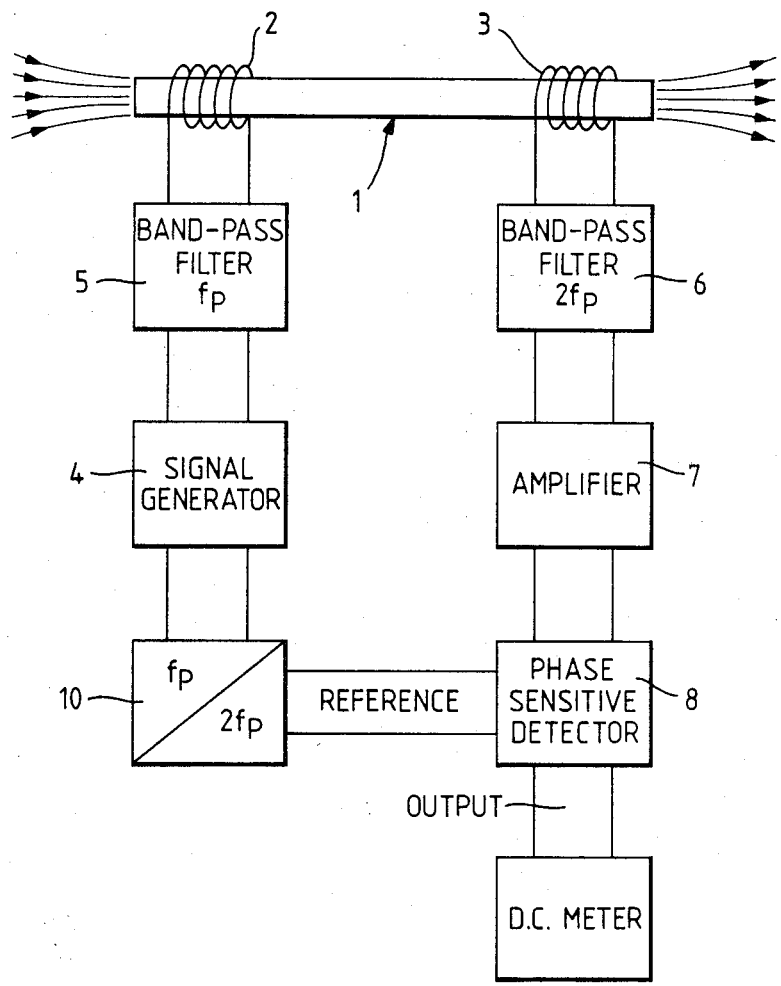

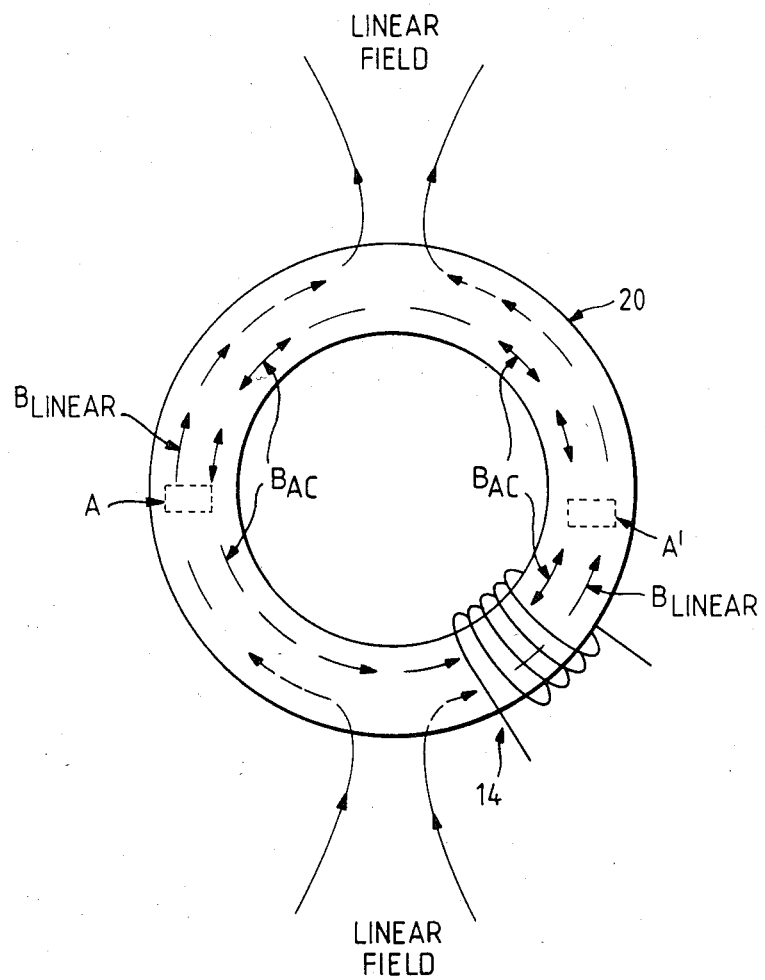

MAGNETIC FIELD SENSOR HAVING A HALL EFFECT DEVICE WITH OVERLAPPING FLUX CONCENTRATORS

BACKGROUND OF THE INVENTION

This invention relates to magnetic field sensors.

A schematic design of a simple type of conventional fluxgate magnetometer is shown in the accompanying FIG. 1. The magnetometer consists of a high permeability ferromagnetic core 1 with a primary winding or excitation coil 2 and a secondary or detection winding 3. The primary winding 2 is excited by a sine wave or triangular wave current derived from a signal generator 4. A band pass filter 5 may be necessary to remove the second harmonic component from the primary winding exciting current.

The amplitude of the primary winding exciting current is adjusted in order to drive the core 1 into saturation. Graphs of the magnetic field intensity (H) in the core, which is proportional to the primary winding exciting current, and the flux density (B) in the core versus time are shown in the accompanying FIGS. 2a and 2b, respectively (solid lines). These graphs assume a triangular waveform from the signal generator 4 and that the B-H curve for the core material is linear up to saturation and then becomes flat (FIG. 2c).

The voltage output from the secondary winding 3 is proportional to dB/dt and hence is a rectangular wave as shown in FIG. 2d. If the B versus time waveform (FIG. 2b) is symmetric then the positive and negative pulses of the secondary winding voltage are equal in amplitude and 180° out of phase. Analysis of this waveform has shown that the second harmonic component is zero. If this conventional fluxgate magnetometer is placed in a d.c. magnetic field which is directed along the core 1, as indicated by the arrows in FIG. 1, then an offset is produced in the H versus time and B versus time graphs, as indicated by the dashed lines in FIGS. 2a and 2b. This leads to a phase shift in the secondary winding voltage, such that the positive and negative pulses are no longer 180° out of phase, but rather are as indicated by the dashed lines in FIG. 2d. The second harmonic components of the positive and negative signals no longer cancel, and a resultant second harmonic signal is produced which for small fields is proportional to the field. The secondary winding output voltage may be bandpass filtered as at 6 (FIG. 1) in order to remove signal components other than the second harmonic component, which is amlified as at 7 and then detected by a phase sensitive detector 8. The polarity of the output as indicated on meter 9 is determined by the direction of the d.c. magnetic field. A frequency doubler 10 serves to provide a reference for detector 8.

Another type of magnetic field sensor is the Hall effect device which, as is well known, comprises a platelike body of a semiconductor material through which a transverse magnetic field may be applied. The effect of the magnetic field is to deflect an electric current flowing across the body between a pair of current electrodes, this deflection of the current introducing a potential difference (Hall voltage) between a pair of sensor or Hall electrodes disposed one each side of a line joining the two current electrodes. In order that Hall effect devices may have the ability to sense weak magnetic fields (10-100 gamma and below), it has previously been proposed to provide the devices with flux concentrators as, for example, disclosed in our British Application No. 8111812 (Ser. No. 2081973) (G. D. Pitt et al) or our British Application No. 8318267 (G. D. Pitt-P. Extance). The latter specification describes the use of a thin ribbon of a magnetic material of high permeability, for example the metallic glass ribbon sold under the trade name "Vitrovac 6025", for the flux concentrators. The plate-like body of semiconductor material may, for example, comprise GaAs. Hall effect devices with metallic glass flux concentrators have sensitivities over two orders of magnitude higher than the conventional Hall effect sensors. However, the offset voltage at zero field and the noise/drift levels limit their usefulness.

SUMMARY OF THE INVENTION

According to one aspect of the present invention there is provided a magnetic field sensor comprising a Hall effect device with a Hall element and flux concentrator means associated with the Hall element; means for generating a varying magnetic field in the flux concentrator means such as to drive said flux concentrator means alternately into and out of magnetic saturation, and means for detecting a second harmonic term in the output voltage of the Hall element when a Hall current is applied to the Hall element and in the presence of a d.c. magnetic field, the amplitude of said second harmonic term providing a measure of the d.c. magnetic field.

According to another aspect of the present invention there is provided a method of sensing a magnetic field including the steps of generating a varying magnetic field in flux concentrator means of a Hall effect device including a Hall element, said flux concentrator means being associated with said Hall element, such as to drive said flux concentrator means alternately into and out of magnetic saturation, applying a Hall current to said Hall element and applying the output voltage of the Hall element to means for detecting a second harmonic term therein, which second harmonic term is generated by a d.c. magnetic field to be sensed when the Hall effect device is disposed therein.

BRIEF DESCRIPTION OF THE DRAWINGS

Embodiments of the invention will now be described, by way of example, with reference to the accompanying drawings, in which:

FIG. 1 shows, schematically, a simple type of conventional fluxgate magnetometer;

FIG. 5 shows, schematically, part of a core type Hall effect fluxgate magnetometer.

DESCRIPTION OF THE PREFERRED DRAWINGS

We have found that Hall effect devices with metallic glass flux concentrators may be employed in such a way as to reduce the minimum detectable magnetic field in a sensor device which works on a similar principle to the conventional fluxgate magnetometer and which we have thus designated as a Hall effect fluxgate magnetometer (Hall fluxgate, for short). A GaAs Hall effect sensor effectively replaces the secondary detector winding of a conventional fluxgate magnetometer and the metallic glass flux concentrator means replace the ferromagnetic core.

Figure 3:
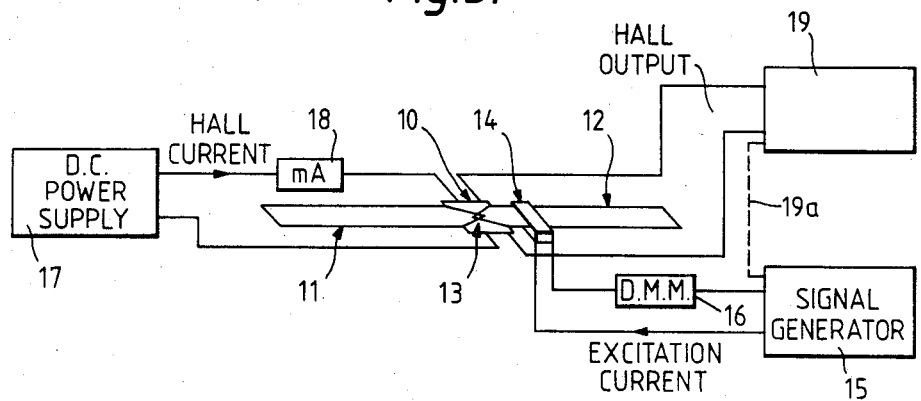
FIG. 3 shows, schematically, an embodiment of Hall effect fluxgate magnetometer according to the present invention.
Figure 4:
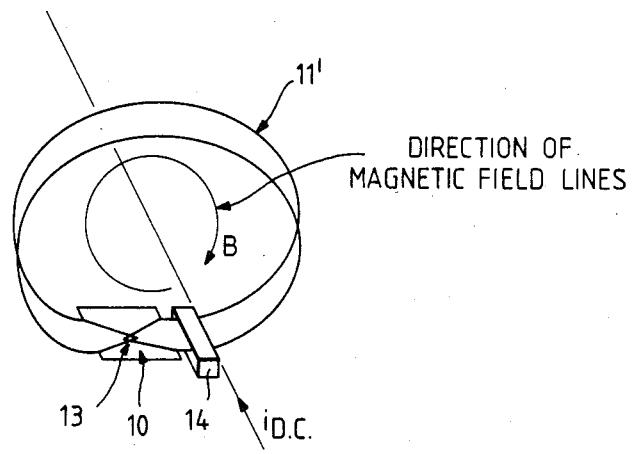
FIG. 4 shows, schematically, an alternative configuration of flux concentrator to that indicated in FIG. 3.

FIG. 3 shows, schematically, an embodiment of a Hall effect fluxgate magnetometer with a flat configuration of flux concentrators, for the detection of linear magnetic fields, and FIG. 4 shows, schematically, a closed loop configuration of a flux concentrator for the detection of circular magnetic fields, such as produced by a d.c. current i passing down a wire extending through the loop.

The magnetometer shown in FIG. 3 comprises a ceramic substrate 10, a first or lower thin-ribbon-form metallic glass flux concentrator 11 with a tapered end portion, a second or upper thin-ribbon-form metallic glass flux concentrator 12 with a tapered end portion and a GaAs Hall effect chip 13 disposed between the tapered end portions of the concentrators 11 and 12, which concentrators 11 and 12 together comprise the above referred to flux concentrator means. The flux concentrators may be bonded to the ceramic substrate with their tapered end portions overlapping and the chip 13 disposed therebetween. The chip 13 may be bonded to one or both of the flux concentrators but is not electrically connected thereto. An excitation coil 14 is shown wound around the flux concentrator 12, alternatively the central area of the Hall effect sensor that is the ceramic substrate and the members bonded thereto may be disposed within a coil with the flux concentrators 11 and 12 extending axially from opposite sides thereof.

An a.c. excitation current, with, for example, a symmetrical triangular waveform, is supplied to the coil 14 from a signal generator 15, a digital multimeter (DMM) unit 16 being incorporated in order to measure the excitation current. The Hall effect chip 13 has four electrodes which may be coupled by interconnection wires (not shown) to conductive tracks (not shown) on the ceramic substrate to which external connections can be made to a power supply for the Hall chip and means for detecting the Hall output voltage. In FIG. 3 a d.c. power supply is indicated at 17, an ammeter 18 being incorporated in the supply circuit to indicate the Hall current supplied. The Hall output voltage is indicated as applied to a unit 19 for detection purposes. The unit 19 may be a spectrum analyser. Alternatively it may comprise a lock-in amplifier with a reference signal derived from the signal generator 15 and coupled thereto over line 19a, the reference signal being at the same frequency as the excitation current. The flux concentrator/Hall chip arrangement of FIG. 3 may be replaced directly by the closed loop single flux concentrator of FIG. 4. Identical reference numerals being used for identical parts. In this case the flux concentrator is a single element 11$^1$.

Figure 2A:
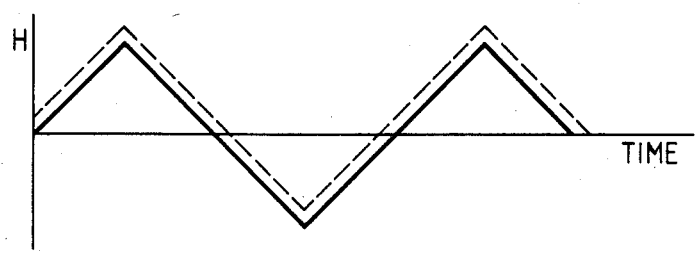
FIGS. 2a, 2b, 2c, and 2d show idealised waveforms illustrating the operation of the fluxgate magnetometer of FIG. 1.
Figure 2B:
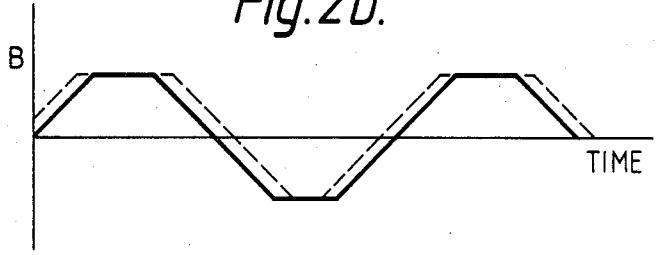
Figure 2C:
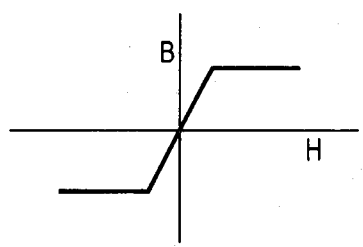
Figure 2D:
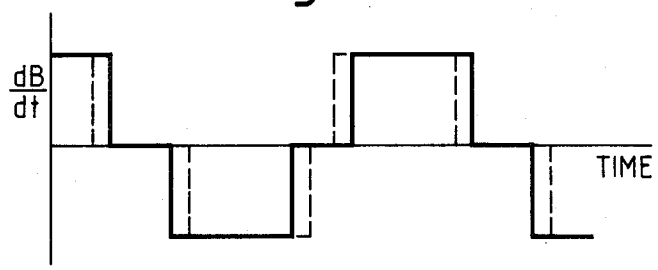

The amplitude of the a.c. excitation current is chosen to be sufficient to drive the flux concentrators into magnetic saturation. With no d.c. magnetic field applied the output from the Hall effect chip, when the Hall circuit is applied thereto, will contain only odd harmonics. Unlike the conventional fluxgate magnetometer the output from the Hall effect device is proportional to B rather than dB/dt, so that the Hall voltage signal produced has a waveform of the FIG. 2b type rather than the FIG. 2d type. This waveform is symmetric, in the absence of a d.c. magnetic field, and the resultant second harmonic component is thus zero. With a d.c. magnetic field present, however, the flux concentrators are driven into and out of saturation at different times causing the waveform to become asymmetric and a second harmonic term to be present in the Hall voltage, since the second harmonic components of the positive and negative signals no longer cancel. The magnitude of second harmonic signal is dependent on the d.c. magnetic field, therefore, by detecting the second harmonic signal a measure of the d.c. magnetic field is available. In FIG. 3 the output from the Hall chip is indicated as connected to the unit (spectrum analyser) 19 so that the second harmonic signal is measured directly. A more practical device is obtained if, as in the conventional fluxgate magnetometer described with reference to FIG. 1, a reference signal is taken from the signal generator (primary oscillator), frequency doubled and then used as a reference for phase sensitive detection of the output signal.

The advantage of the Hall effect fluxgate magnetometer over a conventional Hall effect sensor (with flux concentrators) include (a) a nearly zero offset voltage compared to several millivolts of the conventional sensor, (b) a lower noise signal than the conventional sensor, which noise signal limits the minimum detectable field, and (c) a lower long term drift. The offset voltage for the Hall effect fluxgate magnetometer is defined as the second harmonic voltage with zero applied d.c. magnetic field. The lower offset voltage eliminates the need for offset voltage compensation circuits. The low noise level associated with the second harmonic detection method is due to the fact that noise from the offset voltage is greatly reduced. In contrast the d.c. signal of the conventional sensor is subject to a large amount of noise generated by fluctuations in the offset voltage. The lower noise levels enable the use of higher Hall currents and consequently an increase in accuracy and a smaller minimum detectable field. With regard to (c) above, there is a tendency for the signal from both the second harmonic and the d.c. detection methods of Hall effect sensors to drift with time. This is considered mainly to be due to device temperature variations. The drift noted during experiments with both sensor types shows that the drift in the second harmonic signal was at least an order of magnitude less than that in the d.c. signal. A further advantage of the Hall effect fluxgate magnetometer is that is operates in the saturation region of the flux concentrators, therefore any remanent magnetisation produced by a large external field should be automatically cancelled out by the normal operation of the fluxgate.

The above advantages provide extended operating range and accuracy in comparison with conventional Hall effect sensors. The Hall effect fluxgate magnetometers so far produced have a noise level which is approximately ten times lower than that of the conventional Hall effect (d.c. signal) sensors, however their sensitivity is also lower by a factor of approximately two and a half. Consequently the minimum field detectable by the Hall fluxgate is reduced by a factor of four in comparison with the conventional d.c. Hall sensor.

The Hall effect fluxgate has a lower sensitivity than a conventional fluxgate but has the advantages of being lighter, more compact and requiring only a single coil winding.

The Hall effect fluxgate magnetometer with a flux concentrator in the closed loop configuration will respond to linear d.c. magnetic fields as well as circular fields, its response to linear fields being in a similar manner to the conventional ring core magnetic fluxgate (W. A. Geyger, Nonlinear-magnetic control devices. McGraw-Hill, 1964, p331). If there is a component of the linear field in the plane of the loop of the flux concentrator 20, as shown in FIG. 5, then the Hall effect fluxgate detects the field with a sensitivity depending on the position of the Hall chip relative to the direction of the field. In the conventional ring core magnetic fluxgate there are two parts to the detecting winding, which parts are arranged so that the fundamental of the d.c. excitation current is cancelled out, leaving only the second harmonic signal on the output. This makes the device much more sensitive. It is envisaged that this technique can be applied to the Hall fluxgate, by placing two Hall devices at opposite sides of the flux concentrator loop, as indicated by dashed boxes at positions A and $A^1$ in FIG. 5 so that there is one Hall element disposed on the loop substantially diametrically opposite to another Hall element disposed on the loop. If the outputs of the Hall devices are matched and placed in opposition then the fundamental part of the Hall output voltage signal would cancel, leaving the second harmonic component which can be readily amplified and detected.

We claim:

1. A magnetic field sensor comprising:
   a Hall effect device with a Hall element and flux concentrator means associated with the Hall element;
   means for generating a varying magnetic field in the flux concentrator means such as to drive said flux concentrator means alternately into or out of magnetic saturation, said varying magnetic field generating means comprising a coil through which said flux concentrator means extends, and means for generating an a.c. excitation current and applying said a.c. excitation current to said coil during use of the sensor; and
   means for detecting a second harmonic term in the output voltage of the Hall element when a Hall current is applied to the Hall element and in the presence of a d.c. magnetic field, the amplitude of said second harmonic term providing a measure of the d.c. magnetic field.

2. A sensor as claimed in claim 1, wherein the flux concentrator means is comprised of an amorphous metallic glass of high permeability in thin ribbon form.

3. A sensor as claimed in claim 2, wherein said flux concentrator means comprises a single flux concentrator ribbon element formed into a closed loop with its end portions overlapping and the Hall effect element disposed therebetween.

4. A sensor as claimed in claim 2, wherein the flux concentrator means comprise two flux concentrator ribbon elements disposed to extend generally along a common axis and having end portions thereof overlapping, the Hall element being disposed between the ribbon elements at the overlap.

5. A sensor as claimed in claim 4, wherein at the overlap the respective ribbon element end portions are tapered.

6. A sensor as claimed in claim 3 wherein at the overlap the respective ribbon element end portions are tapered.

7. A sensor as claimed in claim 1 wherein said detecting means comprises a spectrum analyser.

8. A sensor as claimed in claim 1 wherein said a.c. excitation current generating means includes an oscillator for generating said a.c. excitation current at a first frequency, and wherein said detecting means comprises a phase sensitive detector to which said Hall element output voltage is applied and means for generating a reference signal for said phase sensitive detector at a frequency double that of said first frequency.

9. A sensor as claimed in claim 1 wherein said a.c. excitation current generating means includes a signal generator for generating said a.c. excitation current at a first frequency, and wherein said detecting means comprises a lock-in amplifier to which said Hall element output voltage is applied and means for generating a reference signal for said lock-in amplifier at said first frequency.

10. A sensor as claimed in claim 1 wherein the Hall element is comprised of GaAs.

11. A sensor as claimed in claim 1, wherein the flux concentrator means is in the form of a closed loop, wherein the loop extends through the coil, and including a further Hall element, said further Hall element being disposed on said loop substantially diametrically opposite to said first mentioned Hall element.

12. A method of sensing a magnetic field including the steps of generating a varying magnetic field in flux concentrator means of a Hall effect device including a Hall element such as to drive said flux concentrator means alternately into and out of magnetic saturation, said flux concentrator means being associated with said Hall element and extending through a coil, the varying magnetic field generating step comprising applying an a.c. excitation current to said coil; applying a Hall current to said Hall element; and applying the output voltage of the hall element to means for detecting a second harmonic term therein, which second harmonic term is generated by a d.c. magnetic field to be sensed when the Hall effect device is disposed therein.

13. A method as claimed in claim 12 wherein the flux concentrator means is comprised of an amorphous metallic glass of high permeability in thin ribbon form.

14. A method as claimed in claim 12, wherein said detecting means comprises a spectrum analyser.

15. A method as claimed in claim 12, wherein said detecting means comprises a lock-in amplifier to which a reference signal is applied, the frequency of the a.c. excitation current being equal to that of the reference signal.

* * * * *